(12) United States Patent
Kuperman et al.

(10) Patent No.: US 6,650,518 B2
(45) Date of Patent: Nov. 18, 2003

(54) LOAD PROTECTION SYSTEM IN A POWER MODULATOR

(75) Inventors: Grigory Kuperman, Karlsruhe (DE); Klaus-Peter Jüngst, Stutensee (DE)

(73) Assignee: Forschungszentrum Karlsruke GmbH, Karlsruhe (DE)

( * ) Notice: Subject to any disclaimer, the term of this patent is extended or adjusted under 35 U.S.C. 154(b) by 413 days.

(21) Appl. No.: 09/833,006

(22) Filed: Apr. 12, 2001

(65) Prior Publication Data

US 2001/0028542 A1 Oct. 11, 2001

Related U.S. Application Data

(63) Continuation-in-part of application No. PCT/EP99/07882, filed on Oct. 18, 1999.

(30) Foreign Application Priority Data

Nov. 16, 1998 (DE) .......................... 198 52 723

(51) Int. Cl.⁷ .............................. H02H 9/02; H02H 9/04
(52) U.S. Cl. ........................... 361/54; 361/112; 361/58
(58) Field of Search .......................... 361/54, 112, 58; 330/43; 315/3.5; 307/106, 107, 108

(56) References Cited

U.S. PATENT DOCUMENTS

| | | | | |
|---|---|---|---|---|
| 3,636,476 A | * | 1/1972 | Milberger | ..................... 332/7 |
| 3,766,433 A | * | 10/1973 | Nowell | ........................ 317/16 |
| 3,786,275 A | * | 1/1974 | Quesinberry et al. | ....... 307/136 |
| 3,878,449 A | * | 4/1975 | Wilhelmi et al. | ............. 321/15 |
| 4,184,186 A | * | 1/1980 | Barkan | ........................ 323/74 |
| 4,323,853 A | * | 4/1982 | Kurokawa | ................... 330/43 |
| 5,291,143 A | * | 3/1994 | Cronauer | ..................... 328/65 |
| 5,757,599 A | * | 5/1998 | Crane | .......................... 361/56 |
| 5,804,925 A | * | 9/1998 | Salbert | ....................... 315/209 |

FOREIGN PATENT DOCUMENTS

DE 44 40 013 C 1 3/1996

* cited by examiner

*Primary Examiner*—Brian Sircus
*Assistant Examiner*—Zeev Kitov
(74) *Attorney, Agent, or Firm*—Klaus J. Bach

(57) ABSTRACT

In a production system included in a power modulator for the protection of a load connected to the power modulator, comprising a charging system, a power impulse former, a control arrangement and a pulse transformer with a first protection circuit in the form of a crowbar circuit connected to the input side and the load connected to the output side of the pulse transformer, a second protection circuit is connected to the output side of the pulse transformer between the low potential and the ground potential connections thereof wherein the second protection circuit includes a controlled switch with a resistor arranged in parallel therewith.

5 Claims, 5 Drawing Sheets

LOAD PROTECTION SYSTEM IN A POWER MODULATOR

This is a continuation-in-part application of international application PCT/EP99/07882 filed Oct. 18, 1999 and claiming the priority of German application 198 52 723.3 filed Nov. 16, 1998.

BACKGROUND OF THE INVENTION

The invention relates to a protection system in a power modulator for the protection of a load connected to the power modulator.

A power modulator is an apparatus supplying power to technical high-power impulse components, which are connected to the power modulator. Such components are, for example, a klystron or a high power transmitter tube, which are very expensive components that must be protected from destructive operations such as an excessive internal voltage breakdown.

For the generation of high-power pulses energy storage devices are required, which store the energy required for such pulses and transfer it to the load in an extremely short period of time. As energy storage devices, Pulse Forming Networks (PFN) as well as large capacities or inductivities are utilized. The energy varies, depending on applications, from below 1 kJ for example in radar applications up to several MJ in apparatus for nuclear fusion. In any case, the energy, which can be released during a breakdown in the load, for example, in a power klystron must not exceed 20–30 J.

A modulator which utilizes a capacitive storage device has been developed by the Fermi National Accelerator Laboratories (see report on the conference concerning the Twenty First International Power Modulator Symposium, 1994; Jun. 27–30, 1994, Westen Sott Toast, Plasma Hotel, Costa Mesa Calif.; H. Pfeffer et al., 3.3: "A Long Pulse Modulator for Reduced Size and Cost"). This modulator uses a switched condenser bank of moderate size whose voltage drops during the pulse to about 20% of the initial voltage. The energy stored in the condenser bank is connected to the high voltage side of the input of a pulse transformer by way of a cascade of Gate-Turn-Off Thyristors (GTO).

A method and a circuit for the protection of a linear beam apparatus, such as a klystron, from destruction by a cathode-ground-short-circuit is disclosed in U.S. Pat. No. 3,786,275. Power is supplied to the linear beam apparatus in the ground portion thereof and in the collector-electrode by two power supply units arranged in series, which are both associated with the cathode-electrodes. A diode, which is so connected that the current flow away from the collector-electrode is prevented, is arranged between the collector electrode and the connection between the power supply units. The diode prevents in this way a high-current flow from the collector power supply resulting from a short circuit between the cathode and the ground part.

During the impulse a relatively large amount of energy is stored in the stray inductivity and in the main inductivity of the impulse transformer. The amount of this energy (energy in the stray inductivity and in the main inductivity of the impulse transformer is about the same, ca. 400 J) exceeds the admissible energy limit that may be released during a breakdown by an order of size. During a breakdown in the klystron, the control system supplies a signal to the GTO switch for disconnecting the condenser bank from the impulse transformer as well as the ignition switch which ensures a rapid discharge of the condenser bank by way of a small resistor. In this process, the energy stored in the condenser bank is converted in the resistor into thermal energy.

When the condenser bank is disconnected from the load, the energy stored in the stray inductivity is released almost completely in the special two-pole protection circuit, which is arranged in parallel with the primary coil of the impulse transformer. This means that during normal operation of the modulator, the energy released during a breakdown in the klystron does not exceed the admissible value of 20 J. But during a malfunction of the GTO switch or its control system, the above mentioned protection circuit, which is arranged parallel to the primary coil of the impulse transformer, is bridged by the circuit of the ignition switch. In this case, almost the complete energy stored in the impulse transformer is released in the klystron whereby the klystron may be destroyed.

Similar problems are encountered in modulators with an inductive storage (see the conference contribution presented during the above mentioned Power Modulator Symposium in Costa Mesa, H. Salbert et al., under 3.4: "Generation of High Power Pulses Using a SMES").

It is the object of the present invention to expand and improve the protection system in a power modulator, which includes as a load for example a klystron, to such a degree that the energy released in the klystron during a breakdown is substantially reduced and remains within acceptable limits even if the protection means provided in present arrangements fail.

SUMMARY OF THE INVENTION

In a production system included in a power modulator for the protection of a load connected to the power modulator, comprising a charging system, a power impulse former, a control arrangement and a pulse transformer with a first protection circuit in the form of a crowbar circuit connected to the input side and the load connected to the output side of the pulse transformer, a second protection circuit is connected to the output side of the pulse transformer between the low potential and the ground potential connections thereof wherein the second protection circuit includes a controlled switch with a resistor arranged in parallel therewith.

In the protection circuit provided according to the invention, a fault can occur in principle in both current flow directions. In one embodiment of the invention, protection needs to be provided from a breakdown of the load only in one direction as a diode arranged in the circuit determines the admissible breakdown flow direction. In the opposite direction, the diode provides such a high directional resistance that a high current cannot be established in the blocking direction of the diode.

Based on the components, the power modulator consists of a charging system, a power impulse former, a pulse transformer and the load connected thereto. The additional or supplemental protection circuit is disposed on the load side of the pulse transformer between the low potential connection of the pulse transformer and the ground potential. It comprises a controlled switch, which is bridged by a resistor. The resistor is adapted in its size and protective function to the dimensions of the power modulator. Instead of the resistor alone, a series-circuit including the resistor and a capacitor may be used to bridge the controlled switch wherein the dimensions of the resistor and the capacitor are also adapted to the respective functions.

If a fault is to occur only for one direction of current flow, a diode is arranged in series with the protective circuit and the load. The diode prevents substantial current flow in its blocking direction. The diode may be bridged by a resistor of a predetermined size, which limits the voltage potential across the diode.

If the load of the modulator is a klystron, the anode of the diode is connected to the low-potential connector at the load side of the pulse transformer and the cathode is connected to the contact of the switch, which is not at ground potential, or, equally effective, the diode is disposed—in this orientation —between ground potential and the controllable switch.

The advantage of the modulator designed in this manner resides in that the part of the energy resulting from the impulse transformer, which is released during various fault occurrences in the klystron, is substantially reduced with the use of the described additional circuitry.

for example: during malfunction of the commutator in the discharge circuit of the energy storage device the energy from the stray inductivity of the impulse transformer is discharged by way of the ballast resistor arranged in parallel with the switch;

with the above mentioned diode, furthermore, the likelihood of a repeated breakdown of the klystron during the change of the polarity of the voltage effective thereon is substantially reduced.

If however, there is a repeated breakdown of the klystron during the change of the polarity of the voltage effective thereon, a large part of the energy stored in the main inductivity of the impulse transformer is released, not anymore in the klystron, but in the protection circuit proposed herein and in the supplemental circuit mentioned earlier.

The supplemental circuit furthermore provides for a substantial reduction of the energy to be commuted through the protective switch.

Below the invention will be described in greater detail on the basis of the accompanying drawings.

DESCRIPTION OF PREFERRED EMBODIMENTS

Figure 1:
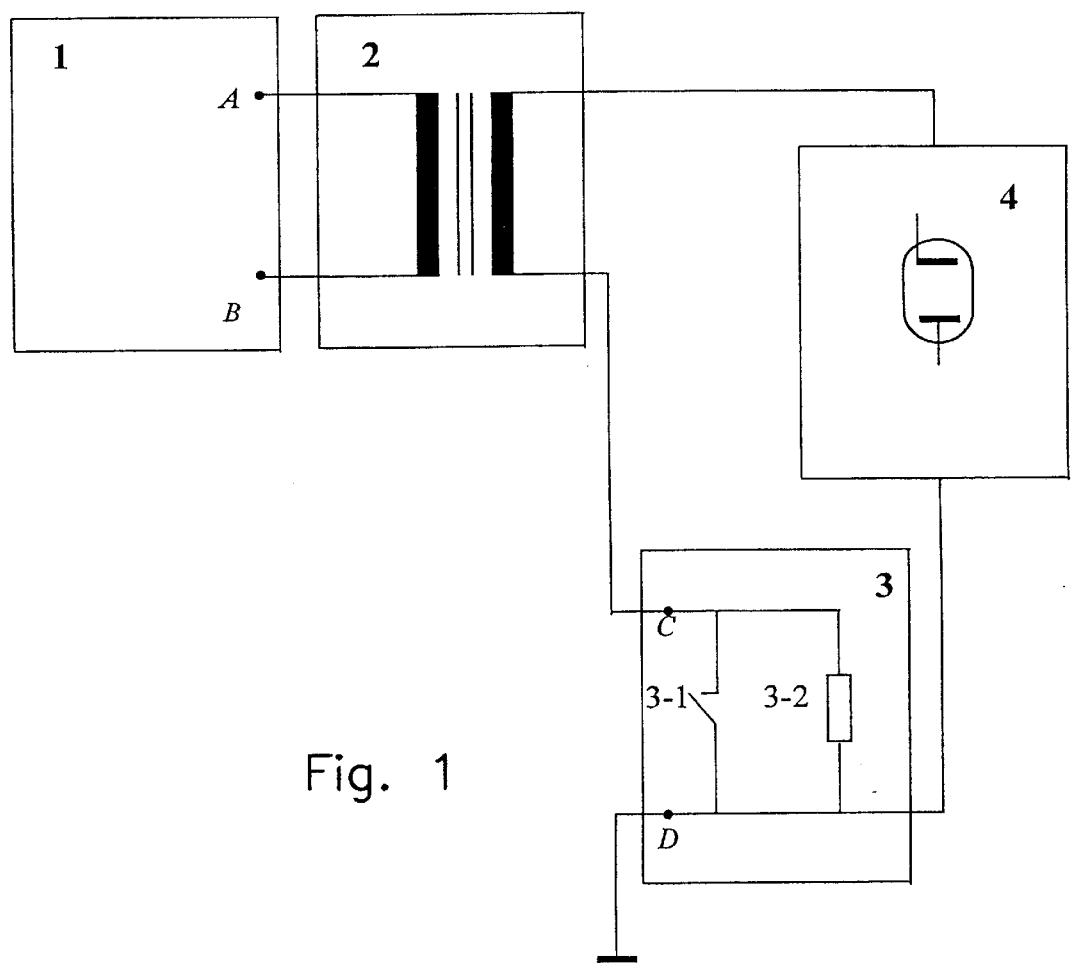
FIG. 1 shows a modulator with a supplemental protective circuit arranged at the load side.
Figure 2:
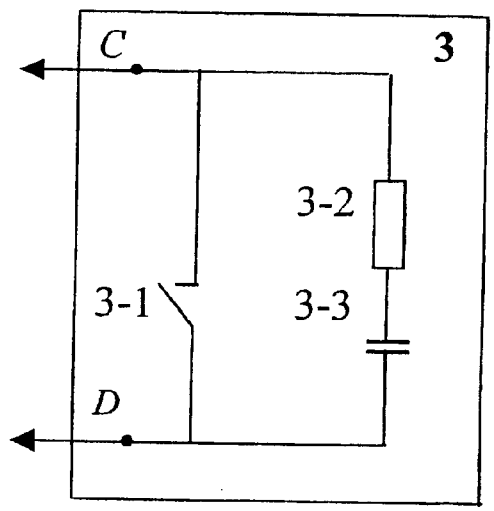
FIG. 2 shows the bridging of the switch by a resistor and a condenser arranged in a parallel circuit with the switch.

As shown in FIG. 1, a power impulse transformer 1 with a charging system is connected to the input of the pulse transformer 2, that is, to the primary coil thereof. The output voltage of the power impulse transformer 1 is transformed for the load 4 by means of the pulse transformer 2 generally to a high voltage. The load-side coil or secondary coil of the pulse transformer 2 forms a circuit with the load 4 and the additional protection circuitry 3. The load 4 in the present case is a klystron with a purely ohmic character. The control switch in the additional protective circuit 3 is a semiconductor switch consisting of IGBT's (Insulated Gate Bipolar Transistor), or IGCT's (Integrated Gate Commutated Thryistor), which are arranged in series in a sufficient number depending on the potential difference to be maintained. Depending on the current to be accommodated, a number of such series arrangements of IGBT's or IGCT's are connected in parallel. Other types of switches, such a vacuum switches may also be used if the requirements can be met by them.

The load impulse former 1 (FIG. 8) is of a design as shown in DE 44 40 013 supplemented however by the ignition switch and the protective circuitry for the protection of the klystron upon the occurrence of a breakdown therein. The power impulse former 1 is a system including two energy storage devices, that is, a condenser 1-2 and a super-conductive magnetic energy storage device 1-3, in short SMES. The power source 1-4 for charging the condenser 1-2 is a controllable power supply by which the predetermined voltage is provided for the condenser 1-2. The voltage source 1-5 for the charging of the SMES 1-3 is a controllable power supply with which the predetermined voltage is generated in the SMES 1-3. The high voltage diode 1-8 in the load circuit prevents a current reversal. The protective circuit 1-9 absorbs the energy stored in the pulse transformer.

The switch 3-1 in the additional protection circuit 3 (FIG. 1) consists of IGBT's or IGCT's arranged in series. The resistance 3-2 absorbs the energy stored in the pulse transformer.

Common devices such as measuring arrangements, a sensor for signaling a breakdown in the klystron, protective circuitry and the electronic control equipment associated therewith are well known in the art and are therefore not shown in the schematic representation of FIGS. 1–6 and 8 for clear representation of the invention.

Figure 3:
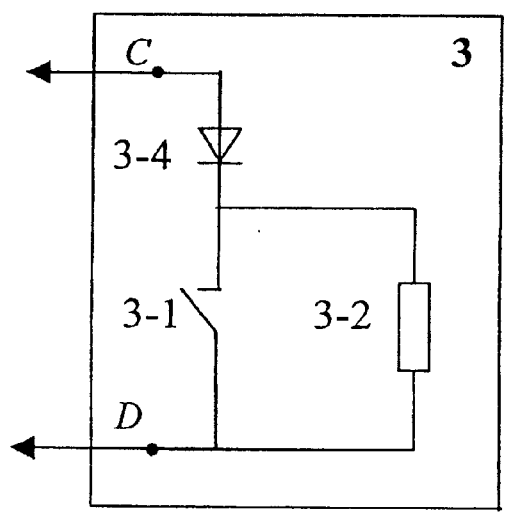
FIG. 3 shows diodes arranged in the circuit in series with the load and the protective circuit.

FIGS. 2 and 4 to 6 show different embodiments of the protective circuit arrangement 3 of FIG. 1 or FIG. 3.

The condenser 3-3 is a high voltage condenser for forming quasi-rectangular impulses in the load-side coil of the pulse transformers 2 during a breakdown in the klystron. The high voltage diode 3-4 prevents a current reversal. The resistor 3-5 limits the voltage at the diode 3-4 and ensures the dissipation of the energy stored in the main inductivity.

Figure 8:
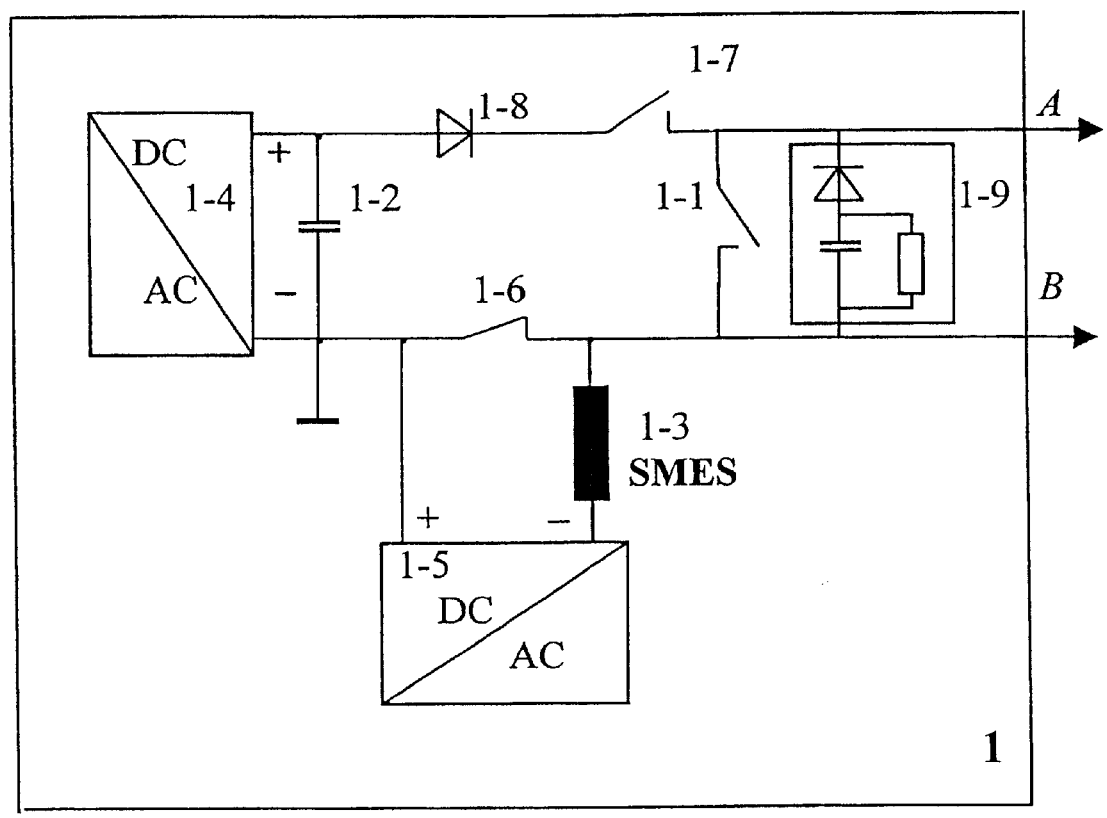
FIG. 8 shows an example for an input circuit arrangement of a power modulator.

The power modulator operates as follows (see FIGS. 1–6 and 8):

During a pulse pause, the condenser 1-2 at the input side is charged by the power source 1-4 to the predetermined voltage and the SMES 1-3 is charged by the voltage source 1-5 with the predetermined current (FIG. 8). As a result, the predetermined initial conditions for the current in the SMES 1-3 and the voltage at the condenser 1-3 are set and the modulator can be operated. That means the two switches 1-6 and 1-7 can be placed synchronously into their complementary state. Together with the switch 1-7, the switch 3-1 in the additional protection circuit is switched.

If the switch 1-7 is in a conducting state together with the above mentioned switch 3-1, neglecting the losses in the discharge circuit of the storage device, the inputs of the current source 1-4 and of the voltage source 1-5 as well as the parasitic parameter of the pulse transformer 2 for the voltage and for the current at the input of the pulse transformer $$u(t)=u_{SMES}(t)+u_c(t) \quad (1)$$

and $$i(t)=[I(0)*(\cos(bt)-(a/b)*\sin(bt))-U_0/L-1/b*\sin(bt)e^{-at} \quad (2)$$

wherein $$a=R/2L$$

the load divided by twice the energy storage inductivity, and b can be determined from $$b^2=1/LC-a^2$$

wherein C is the condenser capacity. The voltage at the secondary coil of the pulse transformer is practically equal the voltage at the klystron.

The equation (2) for i(t) describes the transient discharge of the energy storage C and L during the impulse duration under normal operation.

In the case of a breakdown (when t=td) in the klystron, the switch 3-1 blocks (see FIGS. 1, 2 and 3–6) and the klystron is switched into series with the resistor 3-2. At the same time, or with a slight delay, the ignitron 1-1 (see FIG. 8) is switched on and the flow of energy from the energy storage devices 1-2 and 1-3 to the load (klystron) is interrupted. As energy source, which could be dangerous for the klystron, only the pulse transformer remains. The energy which is stored in the stray inductivity of the pulse transformer after the raise period and the energy stored in the main inductivity toward the end of the impulse exceed, by 5 to 15 times, the admissible energy amount, which may be released to the klystron during a breakdown.

After opening of the switch 1-3, see FIG. 1, the current change in the stray inductivity of the pulse transformer 2 can be represented by the following approximation equation:

$$I_{is}(t) \approx i_\mu(td)+i_{is}(td)e^{-tR/Ls} \quad (3)$$

Wherein the current in the klystron is as follows:

$$I_{K1}(t) \approx i_{is}(td)e^{-tR/Ls} \quad (4)$$

Wherein,
R=the resistance of resistor 3-2
Ls=the stray inductivity of the pulse transformer 2,
$i_{\mu(td)}$=the value of the magnetizing current of the pulse transformer at the moment td of the breakdown in the klystron 4, and
$i_{is}(t)$=the value of the current over the stray inductivity at the moment of breakdown in the klystron 4.

Figure 7:
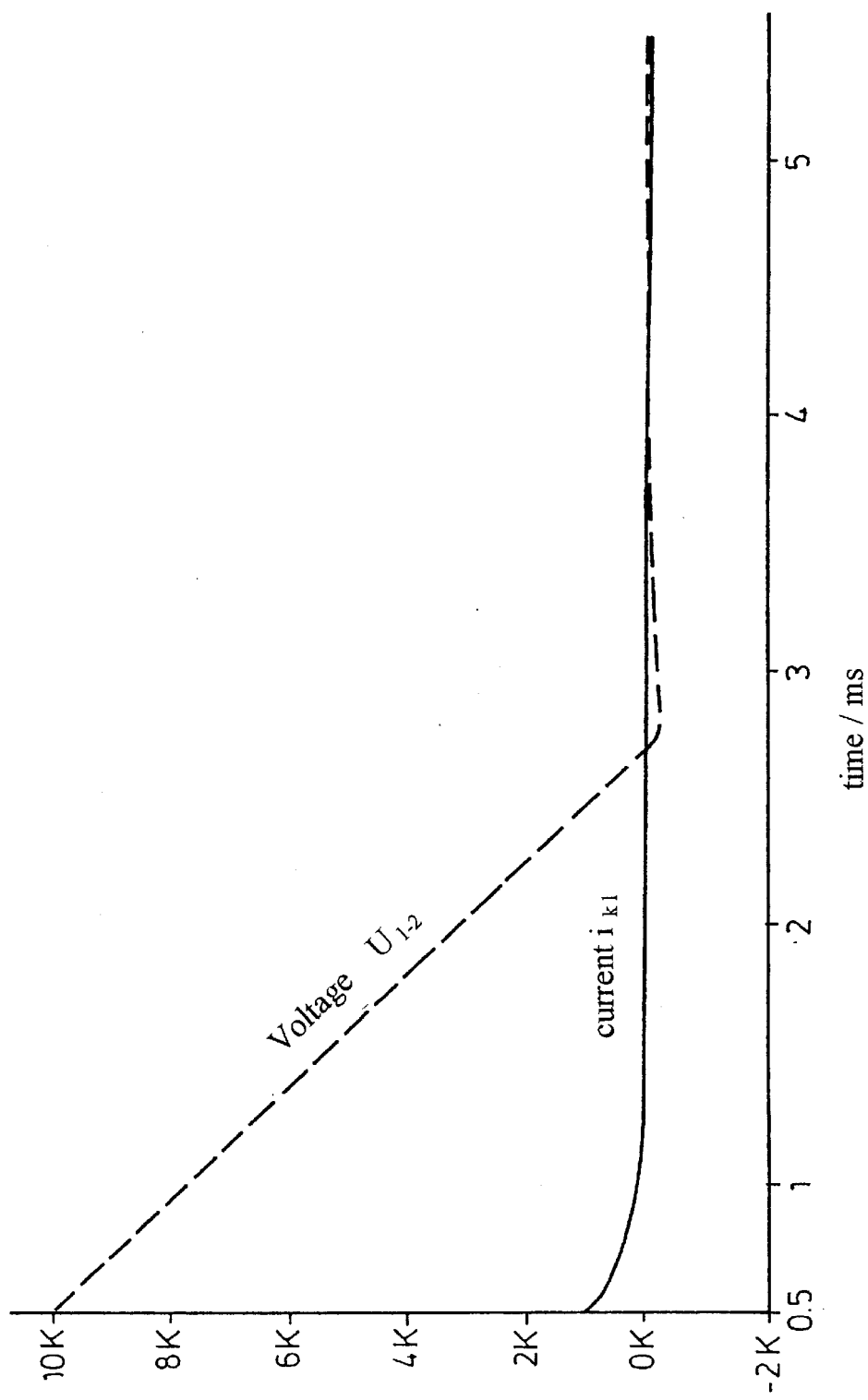
FIG. 7 shows the voltage at the capacitive energy storage device and the current $i_{K1}$ in the klystron over time during a breakdown in the klystron.

After three time constants, $3L_s/R$ the current in the klystron 4 is practically zero (see FIG. 7). During the time the magnetizing current remains practically unchanged and continues to flow through the primary coil of the pulse transformer 2.

The current in the discharge current circuits of the energy storage devices continues to be represented by the equation (2) taking into consideration that, for the time interval under consideration R=0 and a=0 and the initial conditions for the moment of the breakdown in the klystron are defined.

After a change of the polarity of the voltage at the condenser 1-2, the thryister switch 1-6 is switched. As a result, the voltage, with changed polarity, is applied to the ignitron 1-1 and the diode 1-8. The diode 1-8 blocks and the current flow from the energy storage devices to the load is interrupted. After interruption of the current flow from the energy storage devices and the blocking of the ignitron 1-1, the magnetizing current flows through the elements of the two-pole protection circuit 1-9. In this way, a voltage impulse with reversed polarity is generated across the elements of the primary coil of the impulse transformer and at the klystron.

Figure 4:
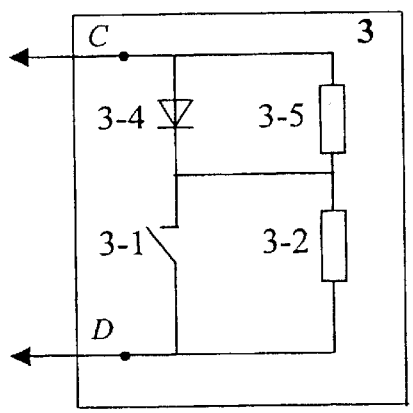
FIG. 4 shows an arrangement, wherein each of the diode and the switch is bridged by a resistor, the resistor bridging the switch being a pure ohmic resistor.
Figure 5:
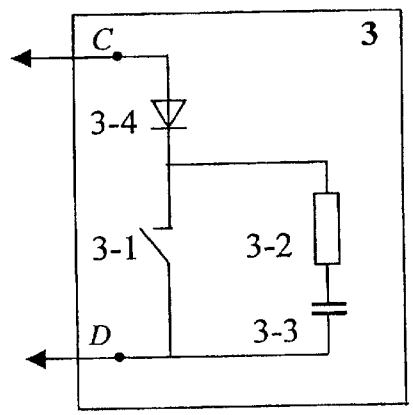
FIG. 5 shows a diode arranged in series with the load and a protective circuit and the switch bridged by a resistor-condenser arrangement.
Figure 6:
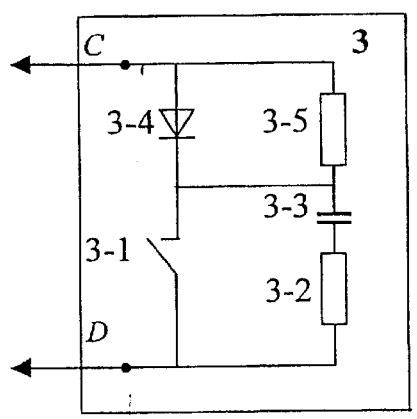
FIG. 6 shows a circuit wherein the diode is bridged by a resistor and the switch is bridged by a series arrangement of a resistor and a condensor.

If no breakdown in reverse direction occurs in the klystron 4, the energy stored in the main inductivity of the pulse transformer is absorbed in the elements of the two-pole circuit 1-9. If a breakdown in reverse direction occurs in the klystron 4, an essential part of the energy stored in the main inductivity of the pulse transformer 2 can be released in the klystron 4. In order to prevent a breakdown in the klystron 4 in the reverse direction, the diode 3-4 is arranged in the embodiment according to FIGS. 3 to 6 of the protection circuit 3 in series with the switch 3-1. The resistor 3-5 limits the voltage across the diode 3-4 (FIGS. 4 and 6).

The switch 3-1 is so designed that it blocks when no control signal is present. It is furthermore made sure that the control signal is only provided during the time in which the high voltage impulse is present and that the control signal can be removed when a breakdown occurs in the klystron. In this case, it is guaranteed in the modulator that the energy released in the klystron during a breakdown is limited even if all the switches provided at the input side of the pulse transformer or the control devices thereof fail.

If in the case of a breakdown in the klystron, the ignitron 1-1 does not switch, the discharge of the energy storage devices 1-2 and 1-3 is continued by way of the load. Then a saturation of the core of the pulse transformer 2 is achieved by a voltage drop across the resistor 3-2 (see FIG. 1) and the energy released in the klystron is limited. This occurs at the moment $t_s$ which is defined by the following equation:

$$[\Delta B] = (1/WS) * \left[ \int_0^{td} u_{K1}(t)dt + \int_{td}^{ts} i_{K1}(t)R_{3-2}dt \right], \quad (5)$$

wherein:
[ΔB]=the saturation induction of the core of the pulse transformer 2,
W=the number of windings of the secondary coil of the pulse transformer 2,
S=the cross-section of the core of the pulse transformer 2,
$U_{K1}(t)$=the voltage at the klystron,
$i_{K1}(t)$=the current in the klystron (see formula above),
$R_{3-2}$=the resistance (see FIG. 1).
The losses in the klystron during a breakdown are determined by the following equation:

$$W_{K1} = U_{K1} * \left[ \int_{td}^{ts} i_{K1}(t)dt + \int_0^{3\tau} i_{K1}(t_s)e^{-t*R(3-2)/Ls}dt \right] \quad (6)$$

In this way, the energy released in the klystron during a breakdown is determined by the moment of the saturation of the pulse transformer $t_s$, specifically by the selection of the resistance $R_{3-2}$ (see FIGS. 1, 3 and 4 as well as the above equation). The moment $t_s$ of the saturation depends also on the moment of the breakdown $t_d$ (see equation (5)).

In the example under consideration, the current in the klystron is limited by the inductivity of the SMES and becomes lower at the rate at which the charge of the condenser 1-2 is reversed. In this case, the condenser 3-3 is switched into the protective circuit in series with the resistor 3-2 (see FIGS. 2, 5, 6) to ensure an optimal impulse form over the transformer coil (quasi-rectangular). This permits a reduction of the energy released during a breakdown in the klystron by 30–50% in addition to the reductions obtained by the insertion of the secondary side resistance and the saturation effects in the pulse transformer.

In an exemplary embodiment, the building components of the power modulator were dimensioned as follows:

| | | |
|---|---|---|
| The klystron | R = | 8 Ω |
| Inductivity of the SUMS | L = | 70 mH |
| Initial current in the SMES | $I_{SMES}$ = | 1250 A |
| Condenser voltage | $V_c$ = | 12 V |
| Condenser capacity | C = | 300 μF |
| Stray inductivity of the pulse transformer | $L_S$ = | 375 μH |
| Main inductivity of the pulse transformer | $L_H$ = | 1.27 H |
| Saturation induction of the core of the pulse transformer 2 | [ΔB] = | 2.7 T |
| Number of windings of the primary coil of the pulse transformer 2 | W = | 128 |
| Cross-section of the core of the pulse trasnformer 2 | S = | 500 cm$^2$ |
| Resistance $R_{3-2}$ (see FIG. 1) | $R_{3-2}$ = | 1.2 Ω |
| Voltage at the klystron upon breakdown in the klystron | $U_{kl}$ = | 100 V. |

The parameter of the resistances, the inductivity and the capacity are given for the primary coil.

In the example under consideration, the energy which is released in the klystron during a breakdown, is about 5 J and therefore substantially below the admissible 20 J.

In the case of a malfunction of the primary side serial switch (or the switching arrangement) the commuted energy is, with the use of the additional switch 3-1 at the secondary side of the pulse transformer, almost an order of size lower than the commuted energy obtained with the use of reserve switch in the discharge circuit of the energy storage device on the primary side, as it is provided in accordance with the state of the art.

In case of a malfunction in the primary side serial switch (or the control arrangement), the energy released in the klystron during a breakdown is reduced with the circuit arrangement proposed herein by more than an order of size in comparison with the state of the art.

If all the switches (or their control arrangements) on the primary side of the pulse transformer 2 in a power pulse transformer malfunction, the energy released in the klystron is in the example under consideration about 65 J, assuming a break-down occurs in the klystron 400 μsec after the beginning of the high voltage impulse. This is less, by more than an order of size, than in a modulator according to the state of the art.

In FIG. 7, the circuit current $i_{K1}$ in the klystron and the voltage $u_{1-2}$ at the condenser 1-2 (energy storage device) are plotted over time for the case that a breakdown occurs in the klystron 400 μs after the beginning of the high voltage impulse. In that case, all switches react according to design; the protective circuit corresponds to that shown in FIG. 1.

What is claimed is:

1. A protection system in a power modulator for the protection of a load connected thereto, comprising:

a charging system, a power impulse former, a control arrangement, a pulse transformer having an input side and an output side with a low potential connection and a ground potential connection with a first protection circuit in the form of a crowbar circuit connected to the input side and said load connected to said output side, and a second protection circuit connected to the output side of said pulse transformer between said low potential connection and said ground potential connection, said second protection circuit including a controlled switch with a resistor arranged in parallel therewith.

2. A protection system according to claim 1, wherein said controlled switch is arranged in parallel with a series arrangement of said resistor and a condenser.

3. A protection system according to claim 1, wherein, between said low potential connection of the load side of said pulse transformer and said ground potential connection, a diode is arranged in series with said parallel circuit arrangement comprising said controlled switch and one of said resistor and condenser, wherein said diode is conductive in the direction of the operating current in said load.

4. A protection system according to claim 3, wherein said diode is bridged by a resistor.

5. A protection system according to claim 1, wherein said load comprises a high power component consisting of one of a klystron, a magnetron and a transmitter tube.

\* \* \* \* \*